(12) United States Patent
Chung

(10) Patent No.: US 12,205,667 B2
(45) Date of Patent: Jan. 21, 2025

(54) MULTI-DIE PACKAGE

(71) Applicant: Realtek Semiconductor Corp., HsinChu (TW)

(72) Inventor: Sheng-Feng Chung, HsinChu (TW)

(73) Assignee: Realtek Semiconductor Corp., HsinChu (TW)

(*) Notice: Subject to any disclaimer, the term of this patent is extended or adjusted under 35 U.S.C. 154(b) by 121 days.

(21) Appl. No.: 17/954,343

(22) Filed: Sep. 28, 2022

(65) Prior Publication Data
US 2023/0116312 A1    Apr. 13, 2023

(30) Foreign Application Priority Data

Oct. 7, 2021 (TW) .................................. 110137316

(51) Int. Cl.
G11C 7/10    (2006.01)
G11C 5/06    (2006.01)

(52) U.S. Cl.
CPC ............. G11C 7/1063 (2013.01); G11C 5/06 (2013.01); G11C 7/1069 (2013.01); G11C 7/1096 (2013.01)

(58) Field of Classification Search
CPC ....... G11C 7/1063; G11C 5/06; G11C 7/1069; G11C 7/1096; G11C 11/4093; G11C 2207/108; G11C 7/10; G11C 5/04; G11C 2207/105; H01L 25/03; H01L 25/18
USPC ............................................. 365/191, 230.06
See application file for complete search history.

(56) References Cited

U.S. PATENT DOCUMENTS

| | | | |
|---|---|---|---|
| 5,646,068 A * | 7/1997 | Wilson ................ | H01L 25/0652 257/E25.011 |
| 5,732,209 A * | 3/1998 | Vigil ............... | G01R 31/318566 714/30 |
| 5,936,877 A * | 8/1999 | Morgan ................. | G11C 5/025 257/692 |
| 7,317,630 B2 * | 1/2008 | Telecco .................... | G11C 7/10 365/189.011 |
| 10,839,918 B1 * | 11/2020 | Chibvongodze .... | H01L 23/5227 |
| 10,917,093 B1 * | 2/2021 | He ......................... | G11C 7/1084 |
| 2004/0100296 A1 * | 5/2004 | Ong .................... | G01R 31/2884 324/750.3 |
| 2005/0253230 A1 * | 11/2005 | Punzalan ............ | H01L 23/4951 257/E23.047 |
| 2005/0262318 A1 * | 11/2005 | Chae ................... | G06F 11/1666 711/162 |

(Continued)

FOREIGN PATENT DOCUMENTS

WO    WO-2007022446 A2 *    2/2007    ....... G01R 31/31701

*Primary Examiner* — Michael T Tran
(74) *Attorney, Agent, or Firm* — Winston Hsu

(57) ABSTRACT

The present invention provides a multi-die package including main die, a memory die, a first set of pins and a second set of pins. The main die includes a memory controller, a first set of pads, a second set of pads and a third set of pads. The memory die is coupled to the first set of pads and the second set of pads of the main die. The first set of pins is coupled to the third set of pads of the main die. The second set of pins is coupled to the second set of pads of the main die. The memory controller accesses the memory die through the first set of pads and the second set of pads, and the memory controller accesses a memory chip external to the multi-die package through the second set of pads and the third set of pads.

8 Claims, 2 Drawing Sheets

(56) References Cited

U.S. PATENT DOCUMENTS

| | | | | |
|---|---|---|---|---|
| 2006/0123292 A1* | 6/2006 | Bansal | H04J 3/047 | |
| | | | 714/724 | |
| 2007/0165461 A1* | 7/2007 | Cornwell | G11C 29/88 | |
| | | | 365/185.33 | |
| 2009/0168518 A1* | 7/2009 | Seong | G11C 8/12 | |
| | | | 365/185.01 | |
| 2013/0010517 A1* | 1/2013 | Chu | G11C 7/109 | |
| | | | 365/63 | |
| 2015/0134918 A1* | 5/2015 | Somaiya | G06F 3/0673 | |
| | | | 711/147 | |
| 2016/0148656 A1* | 5/2016 | Kim | G11C 29/76 | |
| | | | 365/51 | |
| 2016/0267047 A1* | 9/2016 | Kris | G06F 13/385 | |
| 2019/0068743 A1* | 2/2019 | Rowley | H04W 88/16 | |
| 2019/0131972 A1* | 5/2019 | Gans | G11C 7/02 | |
| 2019/0163650 A1* | 5/2019 | Kim | G11C 7/1075 | |
| 2019/0228832 A1* | 7/2019 | Heo | G11C 29/1201 | |
| 2019/0304516 A1* | 10/2019 | Shimizu | G11C 29/52 | |
| 2019/0355428 A1* | 11/2019 | Lee | G11C 7/1063 | |
| 2020/0006163 A1* | 1/2020 | Amir | H01L 23/481 | |
| 2020/0111521 A1* | 4/2020 | Kim | G11C 11/4076 | |
| 2020/0227130 A1* | 7/2020 | Kim | G11C 7/222 | |
| 2020/0233821 A1* | 7/2020 | Kumar | G06F 13/1668 | |
| 2020/0286547 A1* | 9/2020 | Maruyama | G11C 7/04 | |
| 2020/0342942 A1* | 10/2020 | Joe | H10B 41/27 | |
| 2020/0357473 A1* | 11/2020 | Lee | G11C 16/0483 | |
| 2021/0233880 A1* | 7/2021 | Kimoto | H01L 25/0657 | |
| 2021/0286561 A1* | 9/2021 | Bains | G06F 3/0653 | |
| 2021/0295940 A1* | 9/2021 | Lee | G11C 29/48 | |
| 2022/0229599 A1* | 7/2022 | Jo | G06F 13/4282 | |
| 2023/0105208 A1* | 4/2023 | Sirocka | G11C 16/08 | |
| | | | 711/154 | |
| 2023/0129949 A1* | 4/2023 | Lee | G11C 29/022 | |
| | | | 365/189.18 | |

* cited by examiner

MULTI-DIE PACKAGE

BACKGROUND OF THE INVENTION

1. Field of the Invention

The present invention relates to a multi-die package structure of a dynamic random access memory (DRAM).

2. Description of the Prior Art

The current semiconductor packaging technology can integrate multiple dies in a single package to reduce traces and area on a printed circuit board (PCB). For example, DRAM and processor are conventionally divided into two chips/packages, so it is necessary to design multiple traces and pads on the PCB to connect these two chips. If the processor and DRAM are integrated in a single package, the processor can access the DRAM through the traces and pads inside the package, which can reduce the traces and pads on the PCB.

However, if the processor and DRAM are integrated in a single package, since a number of the dies in the package cannot be increased, the capacity of the DRAM can only be maintained at the initial design value, and the chip lacks scalability. In other words, if the designer needs to design processors and DRAMs applied to different products, and the DRAM capacities required by these different products are not exactly the same, the designers will need to design chips for different DRAM capacities, thus increasing design and manufacturing costs.

SUMMARY OF THE INVENTION

It is therefore an objective of the present invention to provide a multi-die package architecture that can allow expansion of the DRAM capacity, to solve the problems described in the prior art.

In one embodiment of the present invention, a multi-die package comprising main die, a memory die, a first set of pins and a second set of pins is disclosed. The main die comprises a memory controller, a first set of pads, a second set of pads and a third set of pads, wherein each of the first set of pads, the second set of pads and the third set of pads comprises a plurality of pads. The memory die is coupled to the first set of pads and the second set of pads of the main die. The first set of pins is coupled to the third set of pads of the main die. The second set of pins is coupled to the second set of pads of the main die. The memory controller accesses the memory die through the first set of pads and the second set of pads, and the memory controller accesses a memory chip external to the multi-die package through the second set of pads and the third set of pads.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
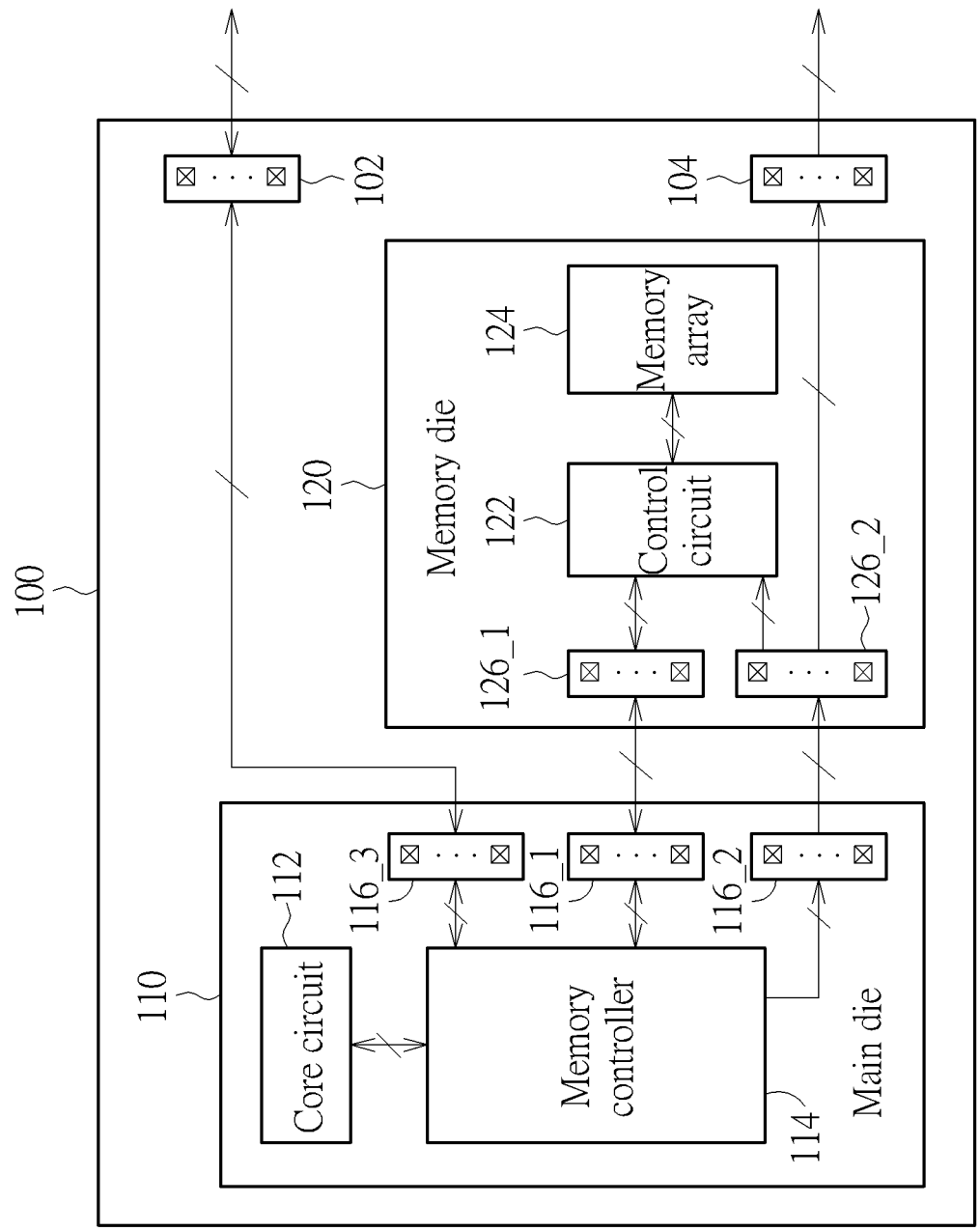
FIG. 1 is a diagram illustrating a multi-die package according to one embodiment of the present invention.

FIG. 1 is a diagram illustrating a multi-die package 100 according to one embodiment of the present invention. As shown in FIG. 1, the multi-die package 100 comprises a main die 110, a memory die 120 and multiple sets of pins (FIG. 1 only shows a first set of pins 102 and a second set of pins 104), wherein each of the first set of pins 102 and the second set of pins 104 comprises multiple pins. In this embodiment, the main die 110 may be a processor such as a central processing unit (CPU), and the main die 110 comprises a core circuit 112, a memory controller 114 and multiple sets of pads (FIG. 1 only shows a first set of pads 116_1, a second set of pads 116_2 and a third set of pads 116_3), wherein each of the first set of pads 116_1, the second set of pads 116_2 and the third set of pads 116_3 comprises multiple pads. In addition, the memory die 120 comprises a control circuit 122, a memory array 124 and multiple sets of pads (FIG. 1 only shows a first set of pads 126_1 and a second set of pads 126_2 related to this embodiment). In this embodiment, the memory die 120 is a DRAM die, and the memory controller 114 of the main die 110 is a DRAM controller, but the present invention is not limited to this.

In this embodiment, the first set of pads 116_1 of the main die 110 are data pads, which are used to transmit data to the memory die 120 through the first set of pads 126_1 of the memory die 120, and/or receive data from the memory die 120. That is, the first set of pads 116_1 of the main die 110 and the first set of pads 126_1 of the memory die 120 are connected through multiple connecting lines, wherein the connecting lines are used for the transmission and reception of multiple bi-directional data signals (DQ), one or more bi-directional data strobe (DQS) signals . . . etc. The second set of pads 116_2 of the main die 110 comprises control signal pads, which are used to transmit a clock signal, a control signal, and an address signal to the second set of pads 126_2 of the memory die 120, and the control signal and address signal are also sent to the components outside the multi-die package 100 through the second set of pins 104. The above-mentioned clock signal, control signal and address signal comprise read command, write command, write enable command, row address strobe, column address strobe, . . . etc. The third set of pads 116_3 of the main die 110 comprise data pads, which are used to transmit data to components outside the multi-die package 100 through the first set of pins 102, and/or receive data from the external components. That is, the third set of pads 116_3 of the main die 110 and the components outside the multi-die package 100 are connected through multiple connecting lines, wherein the connecting lines are used for the transmission and reception of multiple bi-directional data signals (DQ), one or more bi-directional data strobe (DQS) signals, . . . etc. In this embodiment, the path for the memory controller 110 to access the components outside the multi-die package 100 through the third set of pads 116_3 and the first set of pins 102 does not pass through the memory die 120.

In the operation of the multi-die package 100, the memory controller 114 can receive a request from the core circuit 112, and send at least a portion of the data signals, data strobe signals, command signals and clock signals to access the memory die 120. Specifically, the memory controller 114 may comprise related circuits, such as address decoders, processing circuits, write/read buffers, control logic and arbiter etc., for generating data signals, data strobe signals, command signals and clock signals to memory die 120. In addition, in the memory die 120, the control circuit 122 may comprise a read/write controller, a row decoder and a column decoder, wherein the control circuit 122 receives data signals, data strobe signals, command signals and clock signals from the first set of pads 126_1 and the second set of pads 126_2 to access the memory array 124.

In the above embodiments, since the capacity of the memory die 120 in the multi-die package 100 is fixed, therefore, when the multi-die package 100 needs to be applied to other electronic devices with higher memory capacity and performance requirements, the capacity of the memory die 120 is insufficient to meet the demand. Therefore, the multi-die package 100 of this embodiment can be connected with another memory chip to increase the memory capacity and performance. Specifically, referring to FIG. 2, which shows the multi-die package 100 and a memory chip 200, the memory chip 200 comprises a control circuit 210, a memory array 220 and multiple sets of pins (FIG. 2 only shows a first set of pins 202 and a second set of pins 204 related to this embodiment). In addition, in this embodiment, the memory chip 200 is a DRAM chip, the multi-die package 100 and the memory chip 200 are disposed on a PCB, and the first set of pins 102 and the second set of pins 104 of the multi-die package 100 are connected to the first set of pins 202 and the second set of pins 204 of the memory chip 200 through connecting wires on the PCB.

Figure 2:
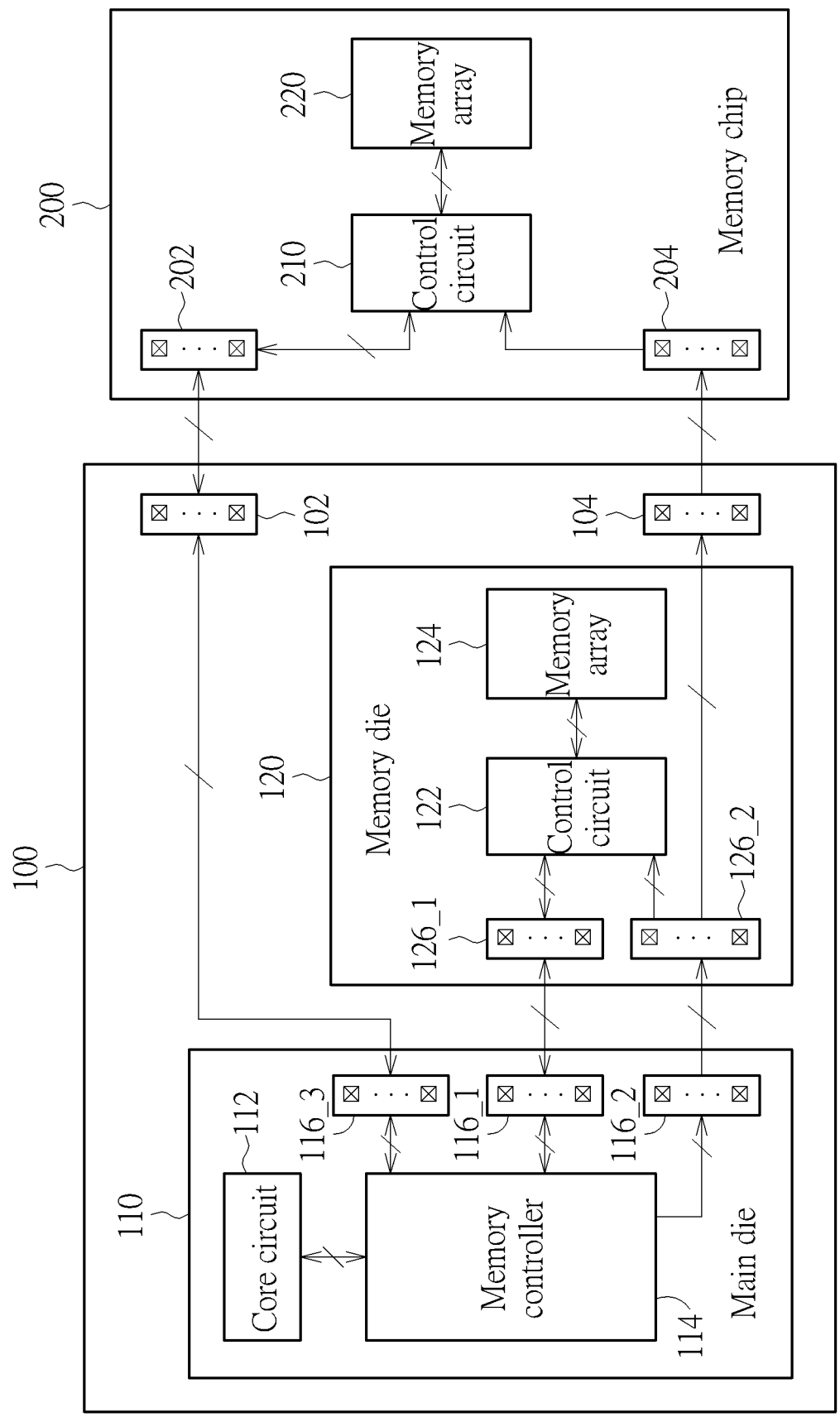
FIG. 2 is a diagram illustrating a multi-die package and a memory chip according to one embodiment of the present invention.

In the operation of the multi-die package 100 and the memory chip 200 shown in FIG. 2, the memory controller 114 can receive requests from the core circuit 112 and send multiple commands to the memory die 120 and the memory chip 200 through the second set of pads 116_2, to access at least one of the memory die 120 and the memory chip 200. Specifically, when the application program executed by the core circuit 112 only needs to use lower memory access speed and lower performance (for example, a lower bandwidth), the memory controller 114 can receive the request from the core circuit 112 and send at least a portion of data signals, data strobe signals command signals and clock signals to the memory die 120 through the first set of pads 116_1 and the second set of pads 116_2, to access the memory die 120, to read data from the memory array 124 or write data into the memory array 124. At this time, since the memory controller 114 does not need to access the memory chip 200, the control circuit 210 within the memory chip 200 can ignore the multiple command signals received from the second set of pins 204, and/or the memory chip 200 can enter a power saving mode. In another embodiment, when the application program executed by the core circuit 112 only needs to use lower memory access speed and lower performance, the memory controller 114 can receive the request from the core circuit 112 and send at least a portion of data signals, data strobe signals command signals and clock signals to the memory die 120 through the second set of pads 116_2 and the third set of pads 116_3, to access the memory chip 200, to read data from the memory array 220 or write data into the memory array 220. At this time, since the memory controller 114 does not need to access the memory die 120, the control circuit 122 within the memory die 120 can ignore the multiple command signals received from the second set of pads 126_2, and/or the memory die 120 can enter a power saving mode.

When the application program executed by the core circuit 112 needs to use higher memory access speed and higher performance (for example, a greater bandwidth), the memory controller 114 can receive the request from the core circuit 112 and send command signals to access the memory die 120 and the memory chip 200 at the same time through the second set of pads 116_2. Specifically, the command signals sent by the memory controller 114 through the second set of pads 116_2 may comprise a write command, the address of the memory array 124 and the address of the memory array 220, and at this time, the memory controller 114 transmits first set of data to the memory die 120 through the first set of pads 116_1, and the first set of data is written into the corresponding address of the memory array 124; and at the same time, the memory controller 114 will transmit second set of data to the memory chip 200 through the third set of pads 116_3, and the second set of data is written into the corresponding address of the memory array 220. In addition, the command signals sent by the memory controller 114 through the second set of pads 116_2 may comprise a read command, the address of the memory array 124 and the address of the memory array 220, and the control circuit 122 in the memory die 120 reads the first set of data from the memory array 124 according to the received address information, and transmits the first set of data to the memory controller 114 through the first set of pads 126_1; and at the same time, the control circuit 210 in the memory chip 200 reads the second set of data from the memory array 220 according to the received address information, and transmits the second set of data to the memory controller 114 through the first set of pins 202.

In one embodiment, the bandwidth of the first set of pads 116_1 used to transmit or receive the first set of data may be the same as the bandwidth of the third set of pads 116_3 used to transmit or receive the second set of data. For example, the bandwidth of each of the first set of data and the second set of data may be 16 bits. The multi-die package 100 can determine whether to use a 16-bit bandwidth or a 32-bit bandwidth based on whether it is connected to the memory chip 200, or whether it is necessary to access the memory die 120 and the memory array 220 at the same time. In another example, the bandwidth of each of the first set of data and the second set of data can be 8 bits, and the multi-die package 100 can determine whether to use an 8-bit bandwidth or a 16-bit bandwidth based on whether it is connected to the memory chip 200, or whether it is necessary to access the memory die 120 and the memory array 220 at the same time.

Briefly summarized, in the multi-die package 100 of the present invention, by using the pads/pins designs in the embodiments, the capacity and speed of the memory can be expanded simply by connecting the memory chip 200 externally. The multi-die package 100 can also be applied to a variety of electronic products with different memory bandwidth requirements to reduce design costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-die package, comprising:
   a main die comprising a memory controller, a first set of pads, a second set of pads and a third set of pads, wherein each of the first set of pads, the second set of pads and the third set of pads comprises a plurality of pads;
   a memory die, coupled to the first set of pads and the second set of pads of the main die;
   a first set of pins, coupled to the third set of pads of the main die; and
   a second set of pins, coupled to the second set of pads of the main die;

wherein the memory controller accesses the memory die through the first set of pads and the second set of pads, and the memory controller accesses a memory chip external to the multi-die package through the second set of pads and the third set of pads;

wherein the memory controller transmits a command signal and an address signal to the memory die and the memory chip through the second set of pads; and the memory controller writes data into the memory die or reads data from the memory die through the first set of pads, or the memory controller writes data into the memory chip or reads data from the memory chip through the third set of pads;

wherein the memory controller determines whether to access only one of the memory die and the memory chip, or to access the memory die and the memory chip at a same time according to a bandwidth required by an application program executed by a core circuit in the main die.

2. The multi-die package of claim 1, wherein when the memory controller needs to access the memory die and the memory chip at the same time, the address signal transmitted by the memory controller to the memory die and the memory chip comprises an address of a first memory array within the memory die and an address of a second memory within the memory chip; and if the command signal transmitted by the memory controller to the memory die and the memory chip comprises a write command, the memory controller transmits first set of data to the memory die through the first set of pads to write the first set of data into the first memory array, and the memory controller transmits second set of data to the memory die through the third set of pads to write the second set of data into the second memory array.

3. The multi-die package of claim 1, wherein when the memory controller needs to access the memory die and the memory chip at the same time, the address signal transmitted by the memory controller to the memory die and the memory chip comprises an address of a first memory array within the memory die and an address of a second memory within the memory chip; and if the command signal transmitted by the memory controller to the memory die and the memory chip comprises a read command, the memory controller receives first set of data from the memory die through the first set of pads, and the memory controller receives second set of data from the memory chip through the third set of pads.

4. The multi-die package of claim 1, where a bandwidth of the data transmitted or received by the first set of pads is the same as a bandwidth of the data transmitted or received by the third set of pads.

5. The multi-die package of claim 4, where each of the bandwidth of the data transmitted or received by the first set of pads and the bandwidth of the data transmitted or received by the third set of pads is 16 bits or 8 bits.

6. The multi-die package of claim 1, wherein the memory controller writes the data into the memory chip or reads the data from the memory chip through the second set of pads and the first set of pins, and a path for the memory controller to access the memory chip through the third set of pads and the first set of pins does not pass through the memory die.

7. The multi-die package of claim 1, wherein the memory controller transmits the command signal and the address signal to the memory die through the second set of pads, and the memory controller transmits the command signal and the address signal to the memory chip through the second set of pads.

8. The multi-die package of claim 1, wherein the memory die is a dynamic random access memory (DRAM) die, the memory chip is a DRAM chip, and the memory controller is a DRAM controller.

* * * * *